United States Patent [19]

Avila et al.

[11] Patent Number: 4,684,900

[45] Date of Patent: Aug. 4, 1987

[54] OPTICAL PUMPING CESIUM RESONATOR AND LASER DIODE DETECTION

[75] Inventors: Gérardo Avila, Antony, France; Pierre Cerez, Mexico, Mexico

[73] Assignee: Compagnie d'Electronique et de Piezo - Electricite C.E.P.E., Argenteuil, France

[21] Appl. No.: 855,419

[22] Filed: Apr. 23, 1986

[30] Foreign Application Priority Data

Apr. 30, 1985 [FR] France .................................. 85 06572

[51] Int. Cl.$^4$ .............................................. H03L 7/26
[52] U.S. Cl. ........................................ 331/3; 331/94.1
[58] Field of Search ...................... 331/3, 94.1; 372/32, 372/70

[56] References Cited

U.S. PATENT DOCUMENTS

| 4,323,860 | 4/1982 | Leiby, Jr. et al. | 331/94.1 X |
| 4,354,108 | 10/1982 | Toyama et al. | 331/94.1 X |
| 4,425,653 | 1/1984 | Cutler | 372/70 |
| 4,454,482 | 6/1984 | DeMarchi | 331/94.1 X |

OTHER PUBLICATIONS

Arditi, "A Caesium Beam Atomic Clock with Laser Optical Pumping, as a Potential Frequency Standard", Metrologia 18, No. 2, 1982, pp. 59-66.
IEEE Journal of Quantum Electronics, vol. QE-5, No. 6, Jun. 5, 1969, pp. 295-297, S. Siahatgar et al., "Display of 8521-A Line of Cesium Utilizing a Swept GaAs Laser", IEEE, New York.

Primary Examiner—Siegfried H. Grimm
Attorney, Agent, or Firm—Roland Plottel

[57] ABSTRACT

A laser diode detection and optical pumping cesium resonator in which the frequency of the laser diode is made dependent on a signal delivered by a detector picking up the fluorescence light emanating from an interaction zone created just at the output of the cesium oven by the interaction of the cesium atom jet and a part of the light beam emitted by said detection diode. In particular, a laser diode detection and optical pumping cesium resonator having a cesium oven emitting a flow of cesium atoms, a resonating cavity in the flow path, a laser diode optical pump delivering a light beam into the atom flow between the cavity and the oven at a first interaction zone and a cesium resonance frequency generator. A detector for detecting fluorencence from a second interaction zone at the cavity output resulting from the interaction of the atom stream with a third laser. The detector delivering a signal representative of the second interaction to frequency control means to control the frequency of the generator. Part of the third laser light is directed at the flow emanating from the oven to create a third interaction zone wherein a second detector picks up fluorescence emanating from the third interaction zone and delivering a signal representative of this third interaction zone to means for controlling the frequency of the third laser.

2 Claims, 3 Drawing Figures

*PRIOR ART*
FIG_1
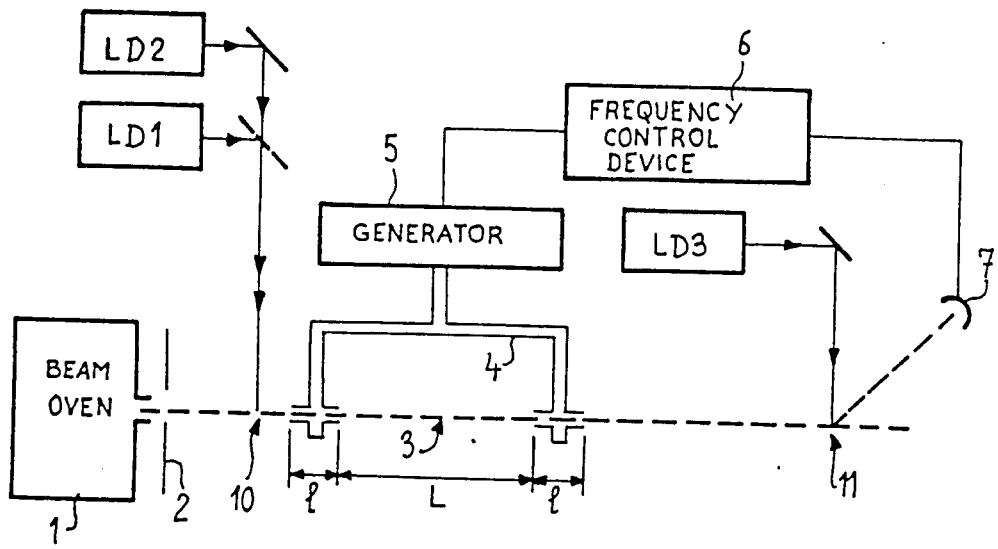
*PRIOR ART*
FIG_2
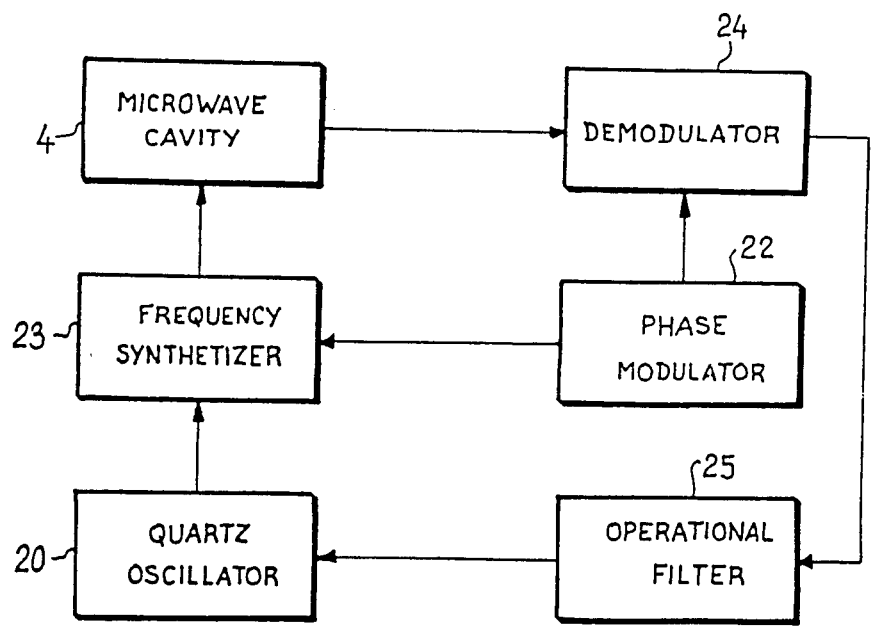

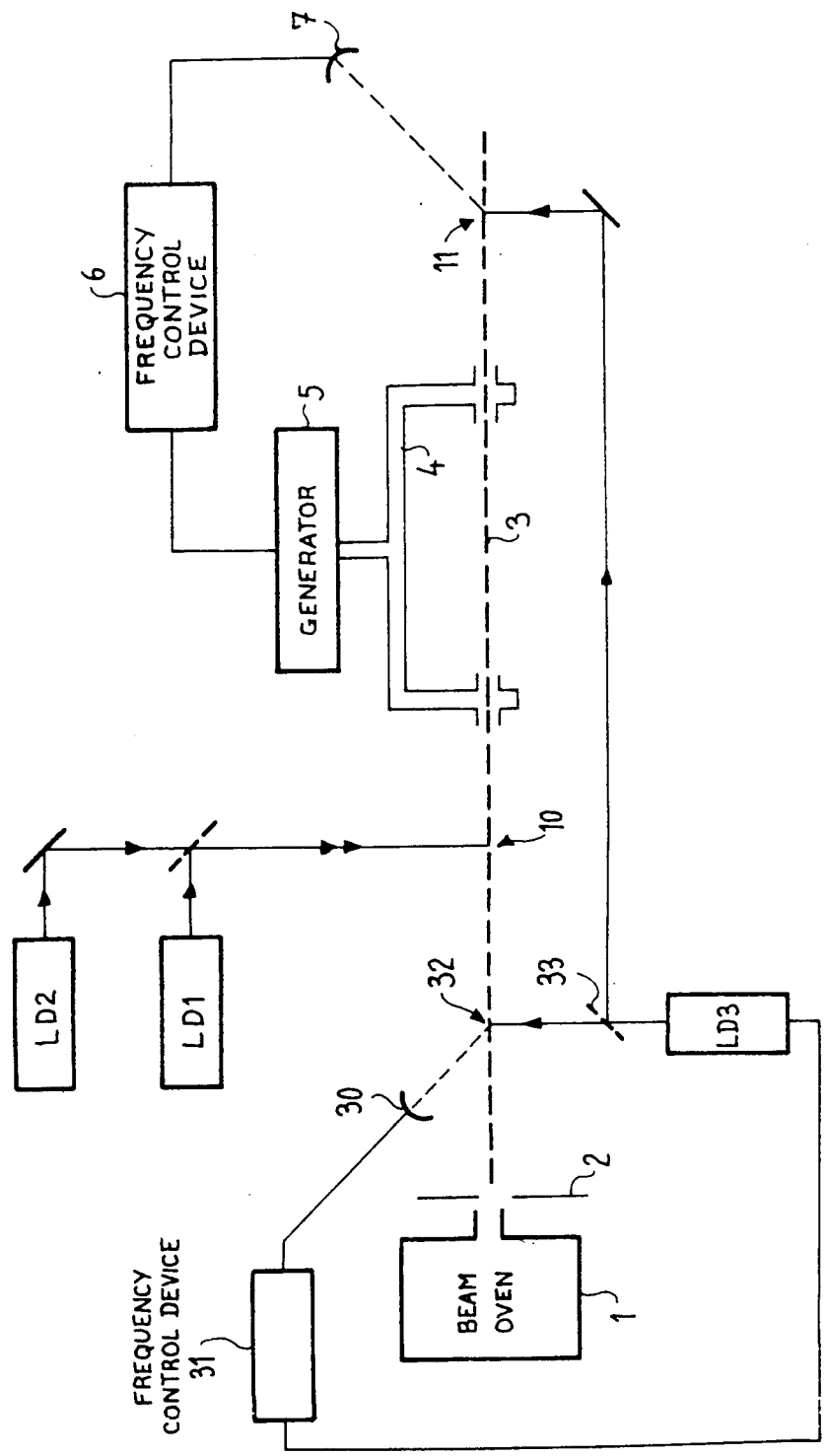
FIG_3

OPTICAL PUMPING CESIUM RESONATOR AND LASER DIODE DETECTION

BACKGROUND OF THE INVENTION

1. Field of the Invention

The present invention relates to an optical pumping cesium resonator and laser diode detection.

At the present time, several thousand atomic clocks are in use. However, modern telecommunication, navigation and pin-pointing systems as well as fundamental and applied research in physics requires the use of clocks which are more and more accurate, and in some cases the present performances of atomic clocks are insufficient for satisfying the expressed needs. Further progress is therefore required.

2. Description of the Prior Art

In the most widely used constructions at the present time, the atoms are deflected in a first two-pole magnet creating an intense and inhomogeneous field. Thus spatial separation of the atoms whose energy is an increasing function of the magnetic field (state $F=4, m_F \geq -3$) and atoms whose energy is a decreasing function of the field (states $F=4$, $m_F=-4$ and $F=3$, $m_F \geq -3$) are obtained. The most interesting states, $F=4$, $m_F=0$ and $F=3$, $m_F=0$ between which the clock transition is effected belong to one or other group. At the input to a resonating cavity the beam is enriched in one or other of the states $F=4$, $m_F=0$ or $F=3$, $m_F=0$ depending on the design. In normal operation, the role of the resonating cavity is to permit the transition $F=3$, $m_F=0 \rightarrow F=4$, $m_F=0$. A second magnet similar to the first deflects towards a hot wire detector the atoms which have undergone the clock transition.

In 1950 M. A. KASTLER proposed replacing the detection and state selection magnets by zones of interaction between the atoms and a light beam. The validity of this proposal was verified by P. CEREZ in 1968 on a rubidium jet. The present interest in such optical methods resides in the development of semiconductor lasers. Some of them generate a 0.85 $\mu$m, beam, in satisfactory coincidence (after sorting) with the D2 resonance spectral line of the cesium atom.

If state selection is effected using a single laser, the $F=4$, $m_F=0$ level may be peopled to the detriment of the $F=3$, $m_F=0$, or conversely.

It is possible to use two lasers LD1, LD2 for optical pumping. It is then hoped to transfer the whole of the atoms peopling the 16 sublevels either to the $F=4$, $m_F=0$ level or to the $F=3$, $m_F=0$ level. The increase of the atom flow in one of the useful levels is favorable to the performances of the clock.

Detection of the clock transmission is effected by observing the fluorescence light emitted by the atoms interacting in the laser beam coming from a third laser diode LD3 tuned to a closed transition with high photon yield per atom.

This optical detection and pumping cesium resonator of the prior art comprises an oven emitting a cesium jet, a resonating cavity situated in the path of the jet, a first interaction zone in which the beams of the two laser diodes LD1 and LD2 interact with the atom so as to create a reversal of population by optical pumping, a third laser diode LD3 emitting a beam which interacts with the atom flow at the output of the cavity, two fluorescence detectors and means for controlling the frequency of the diodes.

But the most delicate point is the optical detection. Great precautions must be taken for stabilizing the frequency of the laser LD3 for the residual fluctuations of its frequency are transformed into fluctuations of amplitude of the detection light. The result is a reduction of the signal to noise ratio on detection of the clock signal and consequently a degradation of the frequency stability of the clock.

There is no advantage in using the fluorescence signal of the detection zone for stabilizing the frequency of LD3 for this latter is low.

In order to overcome these drawbacks, the invention proposes improving the optical detection of the three laser diode cesium resonator. For this, the third laser diode is brought under control in a third interaction zone situated immediately at the output of the oven. A part only of the beam of this third diode is directed towards the second interaction zone as in the case of the three diode resonator of the prior art.

The advantages of the resonator of the invention are the following:

(1) A better frequency stability of the diode is obtained because of the very good signal to noise ratio with which this fluorescence is detected. The frequency control may be rapid, which results in a considerable reduction of the frequency noise of the diode. That avoids having to use for example an intermediate prestabilization loop using a very stable Fabry Perot resonator;

(2) This solution does not disturb the "zero-zero" reversal of useful populations created downstream, in the first interaction zone for a closed transition does not result in population transfer between the hyperfine levels of the fundamental.

SUMMARY OF THE INVENTION

The invention provides then a laser diode detection and optical pumping cesium resonator comprising a cesium oven emiting a flow of cesium atoms, a resonating cavity situated in the path of said flow, at least a first laser diode LD1 and possibly a second laser diode LD2 delivering a light beam which interacts with the atom flow in a first interaction zone situated between the oven and the cavity so as to create optical pumping, a generator generating a hyperfine resonance frequency of the cesium, means for detecting the fluorescence emitted by the cesium atoms at the output of the cavity, said detection means comprising a first detector for detecting the fluorescence light emanating from a second interaction zone resulting from the interaction of the atom jet leaving the cavity and a light beam emitted by a third laser diode LD3, the first detector delivering a signal representative of the second interaction to frequency control means for making the frequency of the generator dependent on the hyperfine transition of the cesium. It is characterized in that a part of the light beam emitted by the third diode LD3 is directed onto the atom flow leaving the oven so as to create a third interaction zone, and a second detector picking up the fluorescence light emanating from the third interaction zone delivers a signal representative of this third interaction to means controlling the frequency of said third laser diode LD3.

BRIEF DESCRIPTION OF THE DRAWINGS

The invention will be better understood from the following embodiments, given by way of non limitative eamples, with reference to the accompanying Figures which show:

FIG. 1, an optical pumping cesium resonator of the prior art;

FIG. 2, a diagram illustrating the principle of controlling the frequency of an oscillator of this resonator; and FIG. 3, the resonator of the invention.

DESCRIPTION OF THE PREFERRED EMBODIMENTS

Since 1967, a second is defined as the "duration of 9 192 631 770 periods of the radiation corresponding to the transition between the two hyperfine levels of the fundamental state of the cesium 133 atom". The cesium clock is the apparatus by which this definition is put into practice. In this respect, there exist two classes of cesium jet clocks:

the primary frequency and time standards. These are laboratory apparatus designed for implementing the definition with the highest possible accuracy;

cesium jet clocks which are industrialized and for which a satisfactory compromise between the performances on the one hand and the compactness, reliability and cost on the other must be found.

If we call $N_1$ and $N_2$ the populations of the energy levels $E_1$, and $E_2$, Boltzmann's law indicates that at thermodynamic balance, we have:

$$N_2/N_1 = \exp(-h\nu/kT)$$

where k is Boltzmann's constant and T the absolute temperature. For $\nu=10$ GHz, we have $h\times\nu=6.6\times10^{-24}$J and for $T=300°$ K., $kT=4.1\times10^{-21}$J. Under these conditions, $(N_2-N_1)/N_1=1.5\times10^{-3}$ and this difference of population is much too small to observe, with a satisfactory signal to noise ratio, any modification of the atomic properties resulting from a hyperfine structure transition. It is therefore necessary to break the thermodynamic balance and to use methods creating a difference of population. These methods are of two types: magnetic deflection and optical pumping.

The cesium jet resonators of the magnetic deflection type comprised a cesium oven for producing the atomic jet, a first selection magnet, a two arm resonating cavity, a second magnet and detection and analysis circuits.

In a small number of laboratory clocks, intended to put into practice as well as possible the definition of the unit of time, the two pole magnets are replaced by multipole magnets (quadripole, hexapole or a combination of the two). Among other advantages, their main advantage results from the fact that they have properties of axial symmetry with respect to deflection of the atoms. Contrary to the preceding case, the oven, the magnets and the detector are aligned. Furthermore, the multipole magnets allow an increase in the intensity of the atom jet; use thereof is therefore favorable to the frequency stability of the clock.

To attempt to reduce the residual errors, a cesium jet clock has been recently developed in which the Stern-Cerlach magnets are replaced by optical pumping and optical detection of the hyperfine resonance following a suggestion by A. Kastler.

Before the appearance of lasers in the near infra red, an attempt at optical pumping of a rubidium 87 jet with spectral lamps had been successively carried out, but the signal/noise ratio of the detection was not sufficient for use in a high precision atomic clock.

The development of tunable lasers (semiconductor lasers or dye lasers) made the efficient hyperfine pumping of a cesium jet possible. For example, with a gallium arsenide (GaAs) laser diode, the emitted wave length is adjusted close to the resonance spectral line D2 of the cesium (852.1 nm) by varying the temperature and is finally tuned to a hyperfine component determined by variation of the current in the diode.

The method of optical pumping is therefore based on the fact of replacing the detection and state selection magnets by interaction zones between the atoms and the light beam. The interest of this optical method at the present time resides in the developments in semiconductor lasers. Some of them generate a light beam at 0.85 $\mu$m, in satisfactory coincidence (after sorting) with the $D_2$ resonance spectral line of the cesium atom.

If state selection is effected using a single laser, the $F=4$, $m_F=0$ level may be peopled to the detriment of the $F=3$, $m_F=0$ level or conversely. The increase of the atom flow in one of the useful levels is favorable to the performances of the clock.

Detection may also be effected optically, by observing the fluorescence light of the atoms undergoing the clock transition, this fluorescence resulting from irradiation by a laser diode LD3.

The general diagram of such a cesium clock with state selection and optical detection is shown in FIG. 1. One or other of the lasers LD1 and LD2 or both may be used.

The cesium atoms emerge from oven 1 which is heated to a temperature of about 100° C. A diaphragm 2 allows an atom jet 3 to be formed shown with a broken line. The device shown in FIG. 1 is equipped with a sealed housing, not shown, so that a high vacuum may be created all along the path of the atom jet. The resonator further comprises a two arm microwave cavity 4, and a generator 5 generating a frequency of 9 192 631 770 Hz. It further comprises a frequency control device 6 and a fluorescence detector 7. Zone 10 is the optical pumping region. Zone 11 is the region for optical detection of the microwave resonance.

Oven 1 emits a flow of cesium atoms 3 in the path of which are situated the two arms of the microwave cavity 4. One or two lasers LD1, LD2 deliver a light beam which interacts with the atom flow in an interaction zone 10 situated between the oven and the cavity so as to create optical pumping.

Means for optical detection of the variation of populations introduced by the microwave resonance are disposed at the output of the microwave cavity 4 and frequency control means are connected to the output of these detection means and to generator 5 so as to control the frequency of this generator by making it dependent on the hyperfine transition of the cesium.

A laser diode LD3 emits a light beam which interacts with the atom flow at the output of this microwave cavity 4.

A detector 7 receives the fluorescence emitted by the atoms after such interaction.

The microwave cavity 4, introduced by Ramsey, is such that the microwave is applied in two regions of a length 1 separated by a distance L along the jet. This technique reduces the width of the resonance spectral line by L/1 with respect to a simple microwave cavity of the same length l, and it further reduces the effects of inhomogeneity of the controlling electric field and eliminates the first order Doppler effect by using a standing microwave instead of a travelling wave.

By low frequency modulation of the microwave excitation signal, a continuous error signal is obtained in a synchronous detection connected to the output of the detector, the polarity of this signal depending on the relative position of the microwave excitation and hyperfine resonance frequencies. A frequency control loop may complete the system and control the quartz by making it dependent on the hyperfine transition. Frequency dividers are finally provided for obtaining impulses every second. Mechanical or electric totalizing counters complete the clock.

Thus, FIG. 2 shows schematically the principle of making the frequency of a quartz oscillator dependent on the resonance of the cesium tube.

The cesium clock is a frequency standard of the passive type: it is necessary to produce the signal at the frequency of the atom transition so as to reveal it. The microwave signal, which feeds the microwave cavity 4, is produced by a frequency synthetizer 23 from a quartz oscillator 20 operating at 5 MHz.

The resonance frequency of the cesium resonator is located in a conventional manner. Using a phase modulator 22, the frequency of the microwave signal is modulated. The component of the response of the cesium tube which has a frequency equal to the modulation frequency is selectively amplified and it is demodulated by demodulator 24 in synchronism with the modulation signal. The result is an error signal when the mean frequency of the microwave signal differs from the resonance frequency of the cesium tube, that is to say from the frequency of the hyperfine transition of the cesium atom in the fundamental state. This error signal is filtered in an operational filter 25 whose output voltage controls the frequency of the quartz oscillator 20. The transfer function of the operational filter 25, which comprises at least one integrator, is determined so as to obtain the desired properties for the frequency control, the most important of which is the response time to a disturbance.

The assembly which has just been described is the main part of the electronics associated with the cesium tube. Other circuits ensure more particularly the production of pulses indicating a time scale.

This cesium clock version provides numerous potential advantages (improvement of the frequency stability in the medium and in the very long term in particular). The most delicate point is then the optical detection. Great precautions must be taken for stabilizing the frequency of the laser LD3 for the residual fluctuations of its frequency are transformed into fluctuations of the amplitude of the detection light. The result is a reduction of signal to noise ratio on detection of the clock signal and consequently degradation of the frequency stability of the clock.

There is no advantage in using the fluorescence signal of the detection zone for stabilizing the frequency of the laser diode LD3, for this signal is small.

The invention allows the frequency of this diode to be controlled by means of a much stronger signal; this is obtained very close to the output of the beam oven in the diagram of FIG. 3.

In FIG. 3, the same references as in FIG. 1 show the same elements. The diode LD3 emits, through a semi reflecting mirror 33, a light beam which interacts with the cesium jet at the output of the resonator (interaction zone 11). The fluorescence light emanating from the interaction is detected as before. The main difference between the resonator of the prior art shown in FIG. 1 and that of the invention is that a part of the laser beam emitted by diode LD3 interacts with the cesium atom jet just at the output of the beam oven (interaction zone 32). The detector 30 picks up the fluorescence light of the atoms and sends a signal representative of this fluorescence to a circuit 31 controlling the frequency of diode LD3.

The resonator of the invention has the following advantages:

1) a better frequency stability of a diode because of the very good signal to noise ratio with which this fluorescence is detected. The frequency control may be rapid, which results in a considerable reduction of the frequency noise of the diode. That avoids having to use for example an intermediate prestabilization loop using a very stable Fabry Perot resonator.

2) the clock signal in fact appears as a variation of the number of fluorescence photons when the microwave resonance at 9.192 GHz is induced in the Ramsey cavity. It necessarily stands out from a continuous background for this background serves first of all for controlling the frequency of LD3. It also serves for the general control of the clock which may cause some disadvantages.

This invention allows the clock transition to be detected on a black background.

This solution does not disturb the population reversal which is created in the optical pumping zone if care is taken to tune the laser LD3 to a closed transition (F=4→F'=5, for example) which has the advantage of having a good fluorescence yield in photons per atom.

In a variant of the invention, a part of the output power of laser LD3 thus stabilized may be fed to the interaction zone 10 through a semireflecting mirror and an acousto-optical modulator. Thus a wave is generated with a slightly different optical frequency which may replace that emitted by the diode LD1 or LD2. The frequency required for controlling the acousto-optical modulator may be 253 MHz.

The resonator of the invention is therefore distinguished from that illustrated in FIG. 1 in that it further comprises a second fluorescence detector 30 and frequency control means 31 receiving the signal from this detector and connected at the output to this laser diode LD3, a part of the beam emitted by this laser diode LD3 interacting with the cesium atom flow before the microwave cavity 4, this second detector 30 receiving the fluorescence emitted by the cesium atoms after such interaction.

With the laser diode LD3 efficiently prestabilized in frequency in region 32 (on a closed transition F=4→F'=5 for example), an improvement of the optical detection of the clock signal is obtained.

The laser diode LD2 may then be omitted and the diode LD3 replaced by this diode LD2. This solution therefore provides a saving of a diode.

The device of the invention improves the frequency stability of the clock with respect to the prior art constructions.

What is claimed is:

1. A laser diode detection and optical pumping cesium resonator comprising a cesium oven emitting a flow of cesium atoms, a resonating cavity situated in the path of said flow, at least a first laser diode and possibly a second laser diode delivering a light beam which interacts with the flow of atoms in a first interaction zone situated between the oven and the cavity so as to create optical pumping, a generator generating a hyperfine resonance frequency of the cesium, means for detecting the fluorescence emitted by the cesium atoms at the output of the cavity, said detection means comprising a first detector for detecting the fluorescence light emanating from a second interaction zone resulting from the interaction of the atom jet leaving the cavity and a light beam emitted by a third laser diode, said first detector delivering the signal representative of the second interaction to frequency control means so as to control the frequency of the generator by making it dependent on the hyperfine transition of the cesium, wherein a part of the light beam emitted by said third diode is directed onto the flow of atoms leaving the oven so as to create a third interaction zone, a second detector picking up the fluorescence light emanating from said third interaction zone and delivering a signal representative of this third interaction to means for controlling the frequency of said third laser diode.

2. The cesium resonator as claimed in claim 1, wherein another part of the beam from said third laser diode is taken and fed through an acousto-optical modulator to said first interaction zone.

* * * * *